(12) United States Patent
Liu et al.

(10) Patent No.: US 12,137,587 B2
(45) Date of Patent: Nov. 5, 2024

(54) FLEXIBLE DISPLAY SCREEN AND DISPLAY DEVICE

(71) Applicant: YUNGU (GU'AN) TECHNOLOGY CO., LTD., Hebei (CN)

(72) Inventors: Chuo Liu, Kunshan (CN); Xiaolong Zhang, Kunshan (CN); Bowen Zhuang, Kunshan (CN); Peng Sun, Kunshan (CN); Dexiong Song, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 574 days.

(21) Appl. No.: 17/472,112

(22) Filed: Sep. 10, 2021

(65) Prior Publication Data

US 2021/0408212 A1 Dec. 30, 2021

Related U.S. Application Data

(63) Continuation of application No. PCT/CN2020/091896, filed on May 22, 2020.

(30) Foreign Application Priority Data

Aug. 2, 2019 (CN) .......................... 201921247471.7

(51) Int. Cl.
| | | |
|---|---|---|
| *H10K 59/131* | (2023.01) | |
| *H10K 50/80* | (2023.01) | |
| *H10K 59/88* | (2023.01) | |
| *H10K 102/00* | (2023.01) | |

(52) U.S. Cl.
CPC ........... *H10K 59/131* (2023.02); *H10K 50/80* (2023.02); *H10K 59/88* (2023.02); *H10K 2102/311* (2023.02)

(58) Field of Classification Search
CPC ....... H10K 59/131; H10K 59/88; H10K 50/80
See application file for complete search history.

(56) References Cited

U.S. PATENT DOCUMENTS 8,063,497 B2 * 11/2011 Tang ..................... H01L 24/17
257/737
2002/0050381 A1 5/2002 Takao
2003/0202150 A1 10/2003 Lee
(Continued)

FOREIGN PATENT DOCUMENTS

CN 1331490 A 1/2002
CN 1470908 A 1/2004
(Continued)

OTHER PUBLICATIONS

International Search Report and Written Opinion (International Application No. PCT/CN2020/091896) with English Translation, dated Aug. 21, 2020, 14 pages.

*Primary Examiner* — Douglas M Menz
(74) *Attorney, Agent, or Firm* — Quarles & Brady LLP (57) ABSTRACT

The present disclosure provides a flexible display screen and a display device. The flexible display screen includes an array substrate and a chip bounding to the array substrate; the chip includes an output end and an input end; a total area of a contact surface between the array substrate and the output end of the chip is equal to a total area of a contact surface between the array substrate and the input end of the chip.

14 Claims, 6 Drawing Sheets

(56) References Cited

U.S. PATENT DOCUMENTS

| | | |
|---|---|---|
| 2005/0162577 A1 | 7/2005 | Yoon |
| 2008/0150857 A1 | 6/2008 | Lee |
| 2021/0175465 A1* | 6/2021 | Zhou .................... H10K 59/131 |

FOREIGN PATENT DOCUMENTS

| | | |
|---|---|---|
| CN | 1629926 A | 6/2005 |
| CN | 101587874 A | 11/2009 |
| CN | 107230667 A | 10/2017 |
| CN | 107833524 A | 3/2018 |
| CN | 210167052 U | 3/2020 |
| JP | 2004214373 A | 7/2004 |

* cited by examiner

FLEXIBLE DISPLAY SCREEN AND DISPLAY DEVICE

CROSS-REFERENCE TO RELATED APPLICATIONS

This application is a continuation under 35 U.S.C. § 120 of international patent application No. PCT/CN2020/091896, filed on May 22, 2020, entitled "Flexible Display Screen and Display Apparatus", which claims priority to Chinese Patent Application No. 201921247471.7, filed on Aug. 2, 2019, entitled "Flexible Display Screen and Display Device", the content of which are hereby incorporated by reference in its entirety.

TECHNICAL FIELD

The present disclosure relates to the field of display technology.

BACKGROUND

With the development of flexible display technology and flexible lighting technology, new display products emerge endlessly. Organic Light-Emitting Diode (OLED) with a plurality of advantages is more and more respected by manufacturers and consumers of display panels and lighting devices, the plurality of advantages includes flexibility, self-luminescence, wide viewing angle, high contrast, low power consumption, high response rate, full color, and simple manufacturing process, etc.

SUMMARY

The present disclosure provides a flexible display screen and a display device to improve the effectiveness of the packaging technology of COP.

In one aspect, the present disclosure provides a flexible display screen, including an array substrate and a chip bounding to the array substrate, the chip comprising an output end and an input end, wherein a total area of a contact surface between the array substrate and the output end of the chip is equal to a total area of a contact surface between the array substrate and the input end of the chip.

In an embodiment, the array substrate is provided with at least one first dummy pad, and the chip is provided with at least one second dummy pad at a position corresponding to the at least one first dummy pad, a contact surface between the array substrate and the chip comprises a contact surface between the at least one first dummy pad of the array substrate and the at least one second dummy pad of the chip.

In an embodiment, the array substrate comprises a plurality of first bumps in a region corresponding to the output end of the chip, the array substrate comprises at least one second bump in a region corresponding to the input end of the chip, the number of the first bumps is greater than the number of the second bumps, an area of a contact surface between each first bump and the output end of the chip is less than an area of a contact surface between each second bump and the input end of the chip.

In an embodiment, the array substrate comprises at least one first bump in a region corresponding to the output end of the chip, the array substrate comprises at least one second bump in a region corresponding to the input end of the chip, the at least one first dummy pad is provided in a region of the array substrate corresponding to the input end of the chip, and the at least one first dummy pad is connected to the at least one second bump.

In an embodiment, the at least one second dummy pad is provided at the input end of the chip, and the at least one second dummy pad is connected to the at least one second bump in the region of the array substrate corresponding to the input end of the chip.

In an embodiment, the array substrate comprises at least one first bump in a region corresponding to the output end of the chip, the array substrate comprises at least one second bump in a region corresponding to the input end of the chip, the at least one first dummy pad is provided in a region of the array substrate corresponding to the input end of the chip, and the at least one first dummy pad is separated from the at least one second bump.

In an embodiment, the at least one second dummy pad is provided at the input end of the chip and corresponds to the at least one first dummy pad.

In an embodiment, a length of a projection of the first dummy pad on a plane where the contact surface between the first dummy pad and the second dummy pad is located is 246 μm.

In an embodiment, the at least one first dummy pad comprises at least two first dummy pads, and the at least one second dummy pad comprises at least two second dummy pads; the at least two first dummy pads are provided in two regions of the array substrate respectively corresponding to the input end of the chip and the output end of the chip, the number of the first dummy pads in the region of the array substrate corresponding to the input end of the chip is greater than the number of the first dummy pads in the region of the array substrate corresponding to the output end of the chip; the at least two second dummy pads are respectively provided at the input end of the chip and the output end of the chip, the number of the second dummy pads provided at the input end of the chip is greater than the number of the second dummy pads provided at the output end of the chip.

In an embodiment, the first dummy pads in the region of the array substrate corresponding to the input end of the chip and the first dummy pads in the region of the array substrate corresponding to the output end of the chip are respectively arranged in an array.

In an embodiment, the number of columns and/or rows of the first dummy pads in the region of the array substrate corresponding to the input end of the chip is greater than or equal to 1.

In an embodiment, an area of a contact surface between each second bump and the input end of the chip is greater than an area of a contact surface between each first bump and the output end of the chip.

In an embodiment, the flexible display screen is an OLED display screen.

In another aspect, the present disclosure further provides a display device, including a device body and the above-mentioned flexible display screen.

For the flexible display screen and the flexible display device provided by the embodiments of the present disclosure, the total area of the contact surface between the array substrate and the output end of the chip is equal to the total area of the contact surface between the array substrate and the input end of the chip, which can effectively avoid the technical problem in the traditional technology that the circuit of the display screen is easy to break, the technical problem is caused by the stress concentration, the stress concentration is caused by the large difference between the area of the contact surface between the input end of the chip and the array substrate of the display screen, and the area of the contact surface between the output end of the chip and the array substrate of the display screen when the input end and output end of the chip are bounding to the array substrate of the display screen.

BRIEF DESCRIPTION OF THE DRAWINGS

In order to illustrate the embodiments of the present disclosure more clearly, the drawings used in the embodiments will be described briefly. Apparently, the following described drawings are merely for the embodiments of the present disclosure, and other drawings can be derived by those of ordinary skill in the art without any creative effort.

DETAILED DESCRIPTION

The exemplary embodiments will be described in detail here, and examples thereof are shown in the accompanying drawings. When the following description refers to the drawings, unless otherwise specified, the same numbers in different drawings indicate the same or similar elements. The implementation manners described in the following exemplary embodiments do not represent all implementation manners consistent with the present disclosure. Rather, they are merely examples of devices consistent with some aspects of the disclosure as detailed in the appended claims.

For the packaging problem of the flexible screen, on the basis of traditional packaging technologies of COF (Chip On Flex or Chip On Film) and COG (Chip On Glass), a packaging technology of COP (Chip On PI) suitable for the flexible screen emerges. Compared to the packaging technologies of COG and COF, the packaging technology of COP refers to a portion of the screen which is used for connecting the circuit board and the control chip is bent directly, so that compared with the packaging technologies of COF and COG, the frame can be further reduced, the screen-to-body ratio can be increased, and an almost frameless effect can be achieved to implement a full-screen display.

Figure 1:
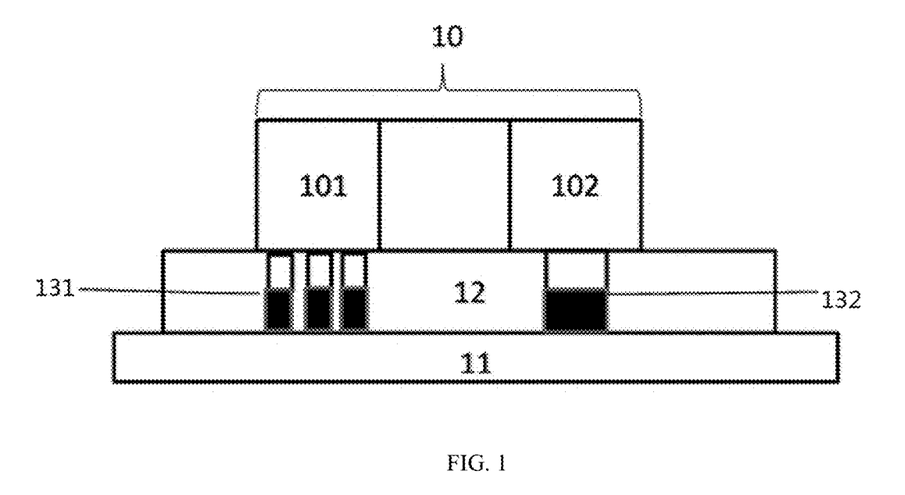
FIG. 1 is a schematic diagram illustrating a bonding between a chip and an array substrate of the display screen.

FIG. 1 is a schematic diagram illustrating a bonding between a chip and an array substrate of the display screen. As shown in FIG. 1, 10 indicates an IC chip; 11 indicates an array substrate; 12 indicates Anisotropic Conductive Film (ACF). The IC chip 10 has an output end 101 and an input end 102. After the bonding, the output end 101 of the IC chip is connected to the array substrate 11 through a plurality of first bumps 131 (also known as goldfinger); the input end 102 of the IC chip is connected to the array substrate 11 through at least one second bump 132 (also known as goldfinger). Since in the packaging technology of COP, a total area of a plurality of contact surfaces between the first bumps 131 of the array substrate 11 and the third bumps of the output end 101 of the IC chip is greatly different from a total area of a plurality of contact surfaces between the second bumps 132 of the array substrate 11 and the fourth bumps of the input end 102 of the IC chip, a great stress can be generated at a position where the total area of the contact surfaces is smaller, that is, the stress is concentrated, which easily causes a problem that the circuit of the display screen is easy to break.

Figure 2:
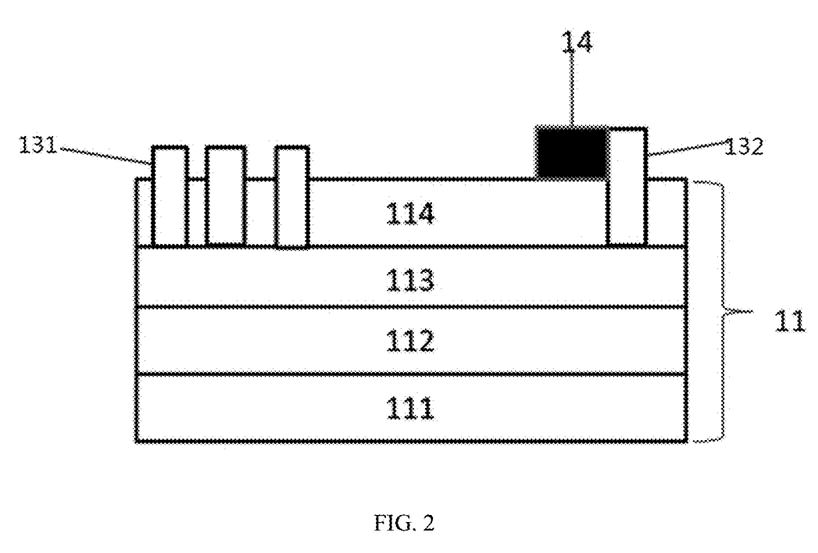
FIG. 2 is a schematic diagram of a flexible display screen according to an embodiment of the present disclosure.
Figure 3:
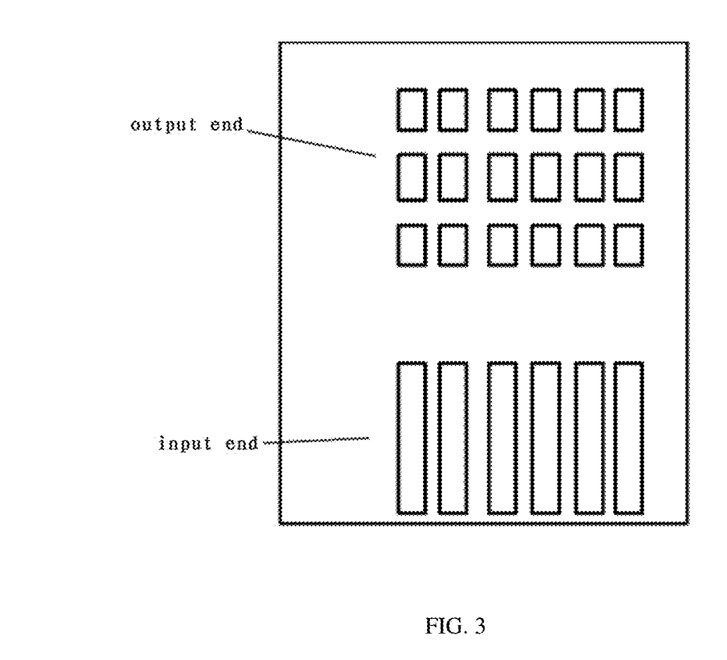
FIG. 3 is a schematic cross-sectional diagram of the flexible display screen shown in FIG. 2.

For the above technical problem, in an embodiment of the present disclosure, a flexible display screen is provided, as shown in FIG. 2 and FIG. 3. In FIG. 2, the array substrate 11 includes an insulating substrate 111 (for example, a polyimide (PI) substrate), a Si layer 112, a circuit layer 113, an insulating layer (or an isolation layer) 114, and a plurality of first bumps 131 and a plurality of second bumps 132 for connecting to the chip. In the embodiment shown in FIG. 2, the number of the first bumps 131 arranged on the array substrate 11 is larger, which are configured to connect to the third bumps of the output end 101 of the chip; the number of the second bumps 132 arranged on the array substrate 11 is smaller, which are configured to connect to the fourth bumps of the input end 102 of the chip. It can be seen from FIG. 2 that the total area of the contact surfaces between the first bumps 131 arranged on the array substrate 11 and the third bumps of the output end 101 of the chip is greater than the total area of the contact surfaces between the second bumps 132 arranged on the array substrate 11 and the fourth bumps of the input end 102 of the chip, which easily causes the stress concentration and leads to the problem of breaking of the circuit of the screen body. In order to solve this problem, the total area of the contact surfaces between the array substrate 11 and the output end 101 of the chip needs to be equal to the total area of the contact surfaces between the array substrate 11 and the input end 102 of the chip.

Therefore, this embodiment provides a solution. As shown in FIG. 2, a plurality of dummy pads 14 are provided in a region on the array substrate 11 corresponding to the input end 102 of the chip, the dummy pads 14 are connected to the second bumps 132 respectively. The provision of the dummy pad 14 is equivalent to an extension of a length of a projection of the second bump 132 on a plane where the contact surface is located. Correspondingly, an extension of a length of a projection of the fourth bump of the input end 102 of the chip on a plane where the contact surface is located is achieved by the same technical mean, thereby increasing the area of the contact surface between the second bump 132 of the array substrate 11 and the fourth bump of the input end 102 of the chip. The length of the projection of the first/second bump refers to a length of the first/second bump along a direction from the first bump 131 to the second bump 132 in a plane where the contact surface is located. FIG. 3 is a schematic cross-sectional diagram of the flexible display screen shown in FIG. 2. As shown in FIG. 3, the length of the projection of each second bump 132 in the plane where the contact surface is located is greater than the length of the projection of each first bump 131 in the plane where the contact surface is located; each second bump 132 is in a region on the array substrate 11 corresponding to the input end 102 of the chip, and each first bump 131 is in a region corresponding to the output end 101 of the chip. At the same time, an extension of the fourth bump of the input end 102 of the chip is achieved by the same technical mean as an extension of the second bump 132, for example, the same dummy pad 14 is added to the input end 102 of the chip, and the dummy pad 14 is connected to the fourth bump of the input end 102 of the chip, which is equivalent to an extension of the length of the projection of the fourth bump of the input end 102 of the chip on the plane where the contact surface is located, so that the total area of the contact surfaces between the array substrate 11 and the output end 101 of the chip is substantially equal to the total area of the contact surfaces between the array substrate 11 and the input end 102 of the chip in the case that the number of the first bumps of the array substrate 11 connected to the third bumps of the output end 101 of the chip is inconsistent with the number of the second bumps of the array substrate 11 connected to the fourth bumps of the input end 102 of the chip, which is beneficial to avoid the breaking of the circuit of the display screen. In an embodiment, an increase of the area of the contact surface between the array substrate and the chip is achieved by providing the dummy pad, which includes: a first dummy pad (14) is provided on the array substrate, and a second dummy pad (not shown) is provided at a position on the chip corresponding to the first dummy pad. The area of the contact surface between the array substrate and the chip includes an area of a contact surface between the first dummy pad of the array substrate and the second dummy pad of the chip.

Optionally, the length of the dummy pad 14 is 246 um. This dummy pad 14 not only helps to effectively extend the length of the second bump 132, but also ensures the process accuracy of the bonding.

Figure 4:
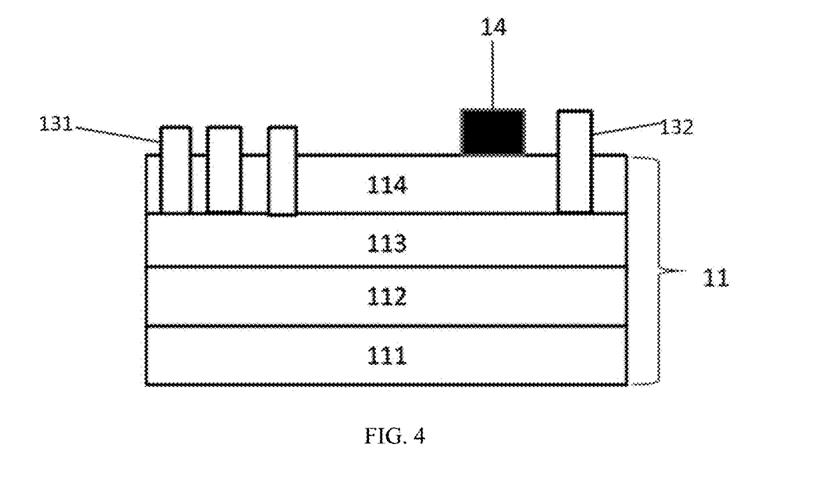
FIG. 4 is a schematic diagram of a flexible display screen according to another embodiment of the present disclosure, in which each dummy pad is separated from a corresponding second bump in a region.
Figure 5:
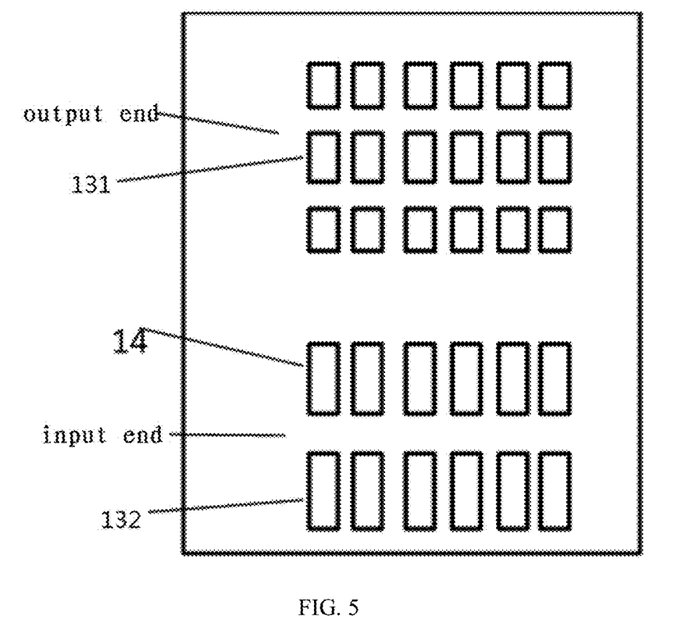
FIG. 5 is a schematic cross-sectional diagram of the flexible display screen shown in FIG. 4.

In another embodiment of the present disclosure, a flexible display screen is provided, as shown in FIG. 4 and FIG. 5. In the related art, there is only one row of second bumps 132 provided in the region of the array substrate 11 corresponding to the fourth bumps of the input end 102 of the chip, and there are three rows of first bumps 131 provided in the region of the array substrate 11 corresponding to the third bumps of the output end 101 of the chip. In this embodiment, a plurality of dummy pads 14 are provided in the region of the array substrate 11 corresponding to the fourth bumps of the input end 102 of the chip, and each dummy pad 14 is separated from a corresponding second bump 132 in the region, so a row of dummy pads 14 corresponding to a row of second bumps 132 in this region are formed. The row of dummy pads 14 is also configured to connect to the fourth bumps of the input end 102 of the chip. Correspondingly, a row of dummy pads is also added at a position of the input end 102 of the chip corresponding to the dummy pads 14 of the array substrate 11, the dummy pads 14 of the input end 102 of the chip are connected to the dummy pads 14 of the array substrate 11, thereby increasing the area of the contact surface between the array substrate 11 and the input end 102 of the chip.

Figure 6:
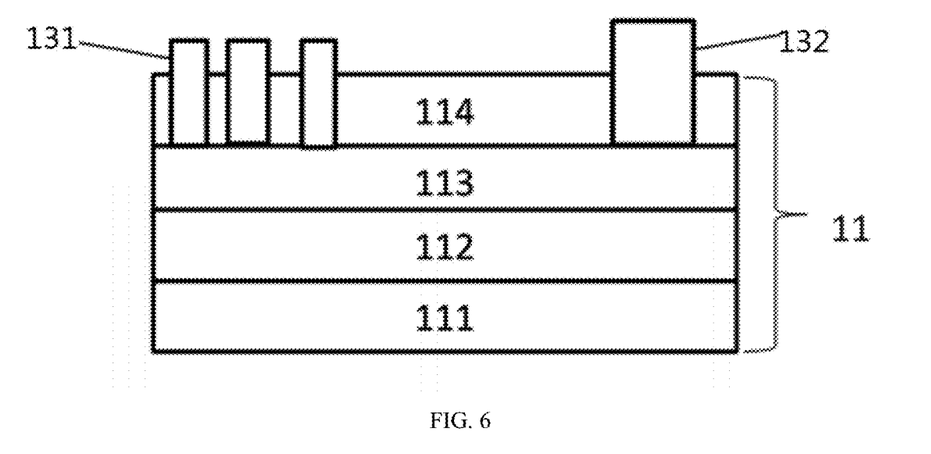
FIG. 6 is a schematic diagram of a flexible display screen according to another embodiment of the present disclosure, in which an area of a contact surface between each second bump of an array substrate and an input end of a chip is significantly larger than an area of a contact surface between each first bump of an array substrate and an output end of the chip.

It should be pointed out that in this embodiment, adding one row of dummy pads 14 is taken as an example for description. It should be understood by those skilled persons in the art that the number of rows of dummy pads 14 is not limited to one. The added dummy pads may not be arranged in rows and columns, as long as the area of the contact surface between the array substrate 11 and the input end 102 of the chip is substantially equal to the area of the contact surface between the array substrate 11 and the output end 101 of the chip after the dummy pads 14 are added. In addition, the first/second bumps of the array substrate 11 themselves may not be limited to a strict row arrangement and/or a strict column arrangement. In an embodiment of the present disclosure, another flexible display screen is further provided, as shown in FIG. 6. In this embodiment, the number of first bumps 131 arranged on the array substrate is larger, and which are configured to connect to the third bumps of the output end 101 of the chip; the number of second bumps 132 arranged on the array substrate is smaller, which are configured to connect to the fourth bumps of the input end 102 of the chip. Since the number of the second bumps 132 arranged on the array substrate is less than the number of the first bumps 131 arranged on the array substrate, the total area of the contact surfaces between the first bumps 131 and the third bumps of the output end 101 of the chip can be substantially equal to the total area of the contact surfaces between the second bumps 132 and the fourth bumps of the input end 102 of the chip by increasing the area of the contact surfaces between the second bumps 132 arranged on the array substrate 11 and the fourth bumps of the input end 102 of the chip. It can be seen from FIG. 6 that the area of the contact surface between each second bump 132 arranged on the array substrate 11 and the fourth bump of the input end 102 of the chip is significantly larger than the area of the contact surface between each first bump 131 and the third bump of the output end 101 of the chip. Correspondingly, the area of the contact surface between the second bump 132 and the fourth bump of the input end 102 of the chip is increased, so that the total area of the contact surfaces between the first bumps 131 and the third bumps of the output end 101 of the chip can be substantially equal to the total area of the contact surfaces between the second bumps 132 and the fourth bumps of the input end 102 of the chip by increasing the area of the contact surface between each second bump 132 and the fourth bump at a corresponding position of the input end 102 of the chip. Compared to the foregoing embodiment, in the technical solution of this embodiment, there is no need to add a dummy pad, which simplifies the process and reduces the complexity of the process.

In an embodiment of the present disclosure, the flexible display screen is an OLED display screen.

In an embodiment of the present disclosure, the OLED display screen is an Active Matrix Organic Light Emitting Diode (AMOLED) display screen. The AMOLED display screen, due to the advantages of light and thin, active light emitting, fast response speed, wide viewing angle, rich in color and high brightness, low power consumption, high and low temperature resistance, etc., has been applied to high-performance and large-size display devices, and has gradually become a new generation of display technology in the display field.

In an embodiment of the present disclosure, a display device is further provided. The display device includes a device body and a display screen. The display screen is the aforementioned flexible display screen. The display device can be a mobile phone, a tablet computer, a notebook computer and other devices. A mobile phone is taken as an example, the device body can include components such as a housing, a circuit board, a battery, and a processor, etc.

The display device has the same advantages with the above-mentioned display screen over the prior art, which will not be repeated here.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A flexible display screen, comprising:
an array substrate, the array substrate comprising at least one first dummy pad, a circuit layer, a plurality of first bumps and at least one second bump, the plurality of first bumps and the at least one second bump electrically connected to the circuit layer, the at least one first dummy pad insulated from the circuit layer; and
a chip bounding to the array substrate, the chip comprising an output end, an input end and at least one second dummy pad at a position corresponding to the at least one first dummy pad, the at least one second dummy pad electrically connected to the at least one first dummy pad, the plurality of first bumps being in a region corresponding to the output end of the chip, the at least one second bump being in a region corresponding to the input end of the chip;
wherein a contact surface between the array substrate and the chip comprises a contact surface between the at least one first dummy pad of the array substrate and the at least one second dummy pad of the chip, a total area of a contact surface between the array substrate and the output end of the chip is equal to a total area of a contact surface between the array substrate and the input end of the chip.

2. The flexible display screen according to claim 1, wherein the number of the first bumps is greater than the number of the second bumps, an area of a contact surface between each first bump and the output end of the chip is less than an area of a contact surface between each second bump and the input end of the chip.

3. The flexible display screen according to claim 1, wherein the at least one first dummy pad is provided in a region of the array substrate corresponding to the input end of the chip, and the at least one first dummy pad is connected to the at least one second bump.

4. The flexible display screen according to claim 3, wherein the at least one second dummy pad is provided at the input end of the chip, and the at least one second dummy pad is connected to the at least one second bump in the region of the array substrate corresponding to the input end of the chip.

5. The flexible display screen according to claim 1, wherein the at least one first dummy pad is provided in a region of the array substrate corresponding to the input end of the chip, and the at least one first dummy pad is separated from the at least one second bump.

6. The flexible display screen according to claim 5, wherein the at least one second dummy pad is provided at the input end of the chip and corresponds to the at least one first dummy pad.

7. The flexible display screen according to claim 3, wherein a length of a projection of the first dummy pad on a plane where the contact surface between the first dummy pad and the second dummy pad is located is 246 um.

8. The flexible display screen according to claim 1, wherein:
the at least one first dummy pad comprises at least two first dummy pads, and the at least one second dummy pad comprises at least two second dummy pads;
the at least two first dummy pads are provided in two regions of the array substrate respectively corresponding to the input end of the chip and the output end of the chip, the number of the first dummy pads in the region of the array substrate corresponding to the input end of the chip is greater than the number of the first dummy pads in the region of the array substrate corresponding to the output end of the chip;
the at least two second dummy pads are respectively provided at the input end of the chip and the output end of the chip, the number of the second dummy pads provided at the input end of the chip is greater than the number of the second dummy pads provided at the output end of the chip.

9. The flexible display screen according to claim 8, wherein the first dummy pads in the region of the array substrate corresponding to the input end of the chip and the first dummy pads in the region of the array substrate corresponding to the output end of the chip are respectively arranged in an array.

10. The flexible display screen according to claim 9, wherein a number of columns and/or rows of the first dummy pads in the region of the array substrate corresponding to the input end of the chip is greater than or equal to 1.

11. The flexible display screen according to claim 3, wherein an area of a contact surface between each second bump and the input end of the chip is greater than an area of a contact surface between each first bump and the output end of the chip.

12. The flexible display screen according to claim 1, wherein the flexible display screen is an OLED display screen.

13. A display device, comprising a device body and the flexible display screen of claim 1.

14. The flexible display screen according to claim 2, wherein a length of a projection of each second bump in a plane where the contact surface is located is greater than a length of a projection of each first bump in a plane where the contact surface is located.

* * * * *